United States Patent

Crumly et al.

[11] Patent Number: 5,924,193
[45] Date of Patent: Jul. 20, 1999

[54] METHOD OF MAKING MANDRELS AND CIRCUITS THEREFROM

[75] Inventors: William R. Crumly, Anaheim; David Swarbrick, Mission Viejo; Haim Feigenbaum, Irvine, all of Calif.

[73] Assignee: Packard Hughes Interconnect Company, Irvine, Calif.

[21] Appl. No.: 08/795,259

[22] Filed: Feb. 10, 1997

[51] Int. Cl.⁶ ........................................ H05K 3/02
[52] U.S. Cl. ........................ 29/846; 29/830; 205/67
[58] Field of Search ............................ 29/848, 825, 830; 205/67

[56] References Cited

U.S. PATENT DOCUMENTS 4,116,517  9/1978  Selvin et al. .
4,528,577  7/1985  Cloutier et al. .
5,207,887  5/1993  Crumly et al. ............................. 205/78

*Primary Examiner*—Carl J. Arbes
*Attorney, Agent, or Firm*—Cary W. Brooks; Patrick M. Griffin

[57] ABSTRACT

The present invention generally includes a process in which a mandrel for semi-additive construction of circuitry is fabricated by laminating shim stock or foil of stainless steel onto a suitable deformable substrate such as a polyimide glass board. Dimples for making raised features on circuitry are formed in the mandrel with a tool. The use of shim stock makes the mandrel relatively light and suitable for automated processing similar to that used to construct circuits on circuit boards.

6 Claims, 3 Drawing Sheets

METHOD OF MAKING MANDRELS AND CIRCUITS THEREFROM

TECHNICAL FIELD

This invention relates to methods of making mandrels and semi-additive circuits with raised features therefrom.

BACKGROUND OF THE INVENTION

Heretofore, semi-additive circuitry with raised features have been manufactured utilizing a solid sheet of stainless steel as the mandrel. Crumly et al, U.S. Pat. No. 5,207,887 issued May 4, 1993, the disclosure of which is hereby incorporated by reference, sets forth such a process. In the prior art, solid sheets of stainless steel 0.06 inches thick or thicker were used for mandrels. However, as mandrel sizes became larger, the weight of the mandrel became excessive and difficult to move from station to station in any type of automated semi-additive circuitry manufacturing process.

The present invention provides alternatives and advantages over the prior art.

SUMMARY OF THE INVENTION

The present invention generally includes a process in which a mandrel for semi-additive construction of circuitry is fabricated by laminating shim stock or foil of stainless steel onto a suitable deformable substrate such as a polyimide glass board. Dimples are formed in the mandrel with a tool. The dimples are used to make raised features in circuitry additively constructed on the mandrel. The use of shim stock or foil makes the mandrel relatively light and suitable for automated processing similar to that used to construct circuits on circuit boards.

These and other objects, features and advantages of the present invention will become apparent from the following brief description of the drawings, detailed description, and appended claims and drawings.

DESCRIPTION OF THE PREFERRED EMBODIMENT

Figure 1:
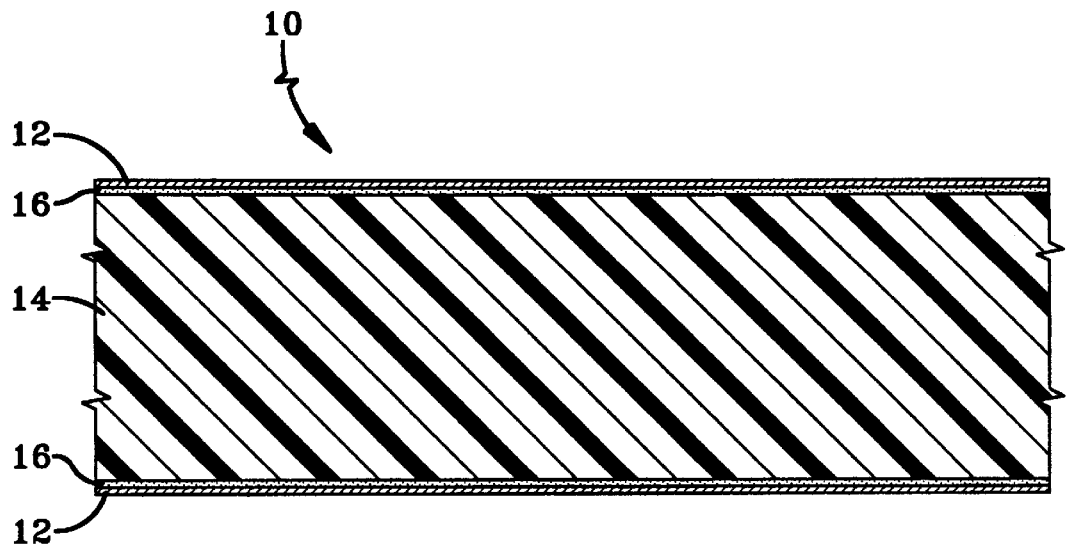
FIG. 1 illustrates a composite mandrel according to the present invention.
Figure 2:
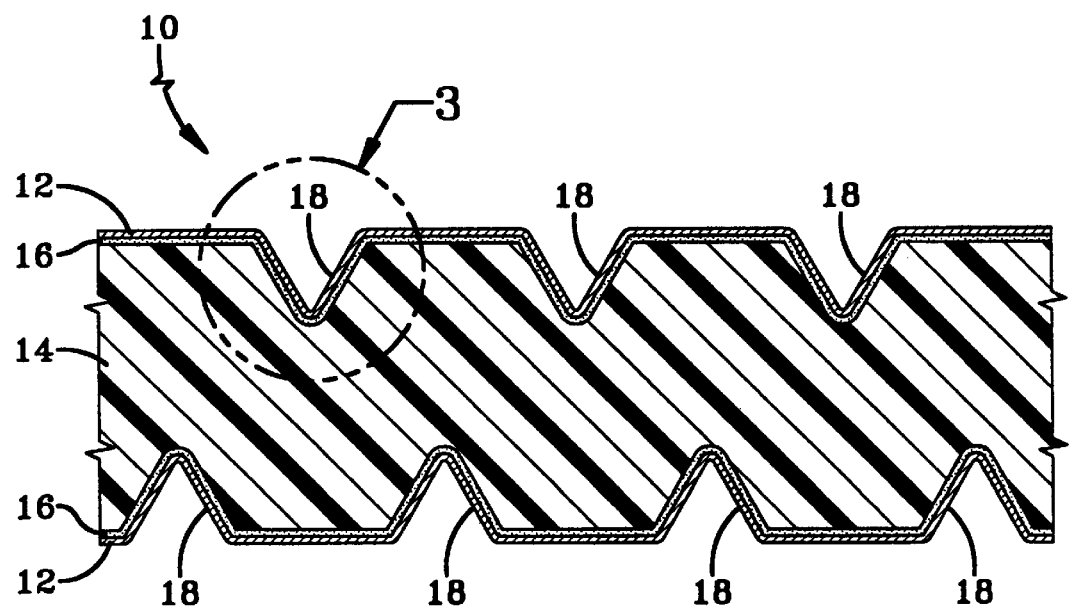
FIG. 2 show a composite mandrel with dimples formed therein according to the present invention.
Figure 3:
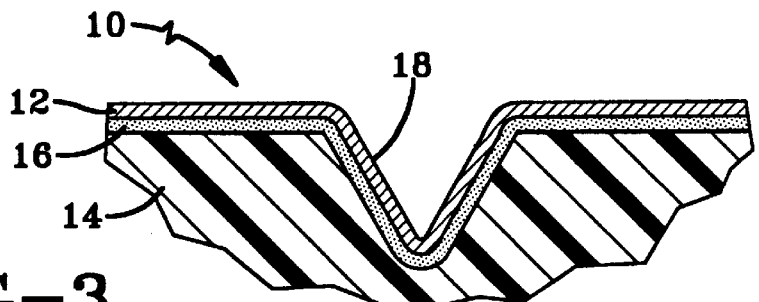
FIG. 3 is an enlargement of a portion of FIG. 2.

A mandrel 10 for making semi-additive construction of a circuit is fabricated by laminating a shim or foil stock 12 of semi-stainless steel onto a suitable deformable and flexible substrate 14 such as a polyimide glass board. The shim or foil stock of stainless steel has a thickness ranging from 2 to 4/1000 inches. The shim or foil stock 12 can be bonded to the substrate 14 with common adhesives as long as the adhesive layer 16 is capable of surviving the lamination conditions encountered during circuit fabrication described hereafter. The adhesive does not necessarily have to have a good adhesion during lamination, only survive.

The substrate 14 is made from a flexible material which is relatively light and will deform when dimples are forced into the shim stock using a mechanical dimple-forming tool. When the dimple 18 is formed in the shim stock, a smooth dimple-forming surface is formed throughout. In the prior art methods which used thicker sheets of stainless steel, a lip would often form near the flat surface of the solid sheet of stainless steel due to the relatively unforgiving strength of the stainless steel. As a result, occasionally it would be difficult to remove the semi-additive circuitry from the mandrel.

By making the mandrels out of composite of glass reinforced polyimide with stainless steel foil bonded to one or both sides, lightweight mandrels can be made that have the desirable properties of the mandrel without the handling problems. The handling would be similar to that of circuit boards of similar thickness, allowing the use of off-the-shelf technology in high volume plants to move the mandrel from station to station during the circuitry fabrication process. By laminating a second sheet or more of shim stock, the mandrel can be reused with a new dimple pattern. Further, since the substrate is nonconductive, plating does not have to be removed from the edges of the mandrel, simplifying mandrel conditioning.

Figure 4:
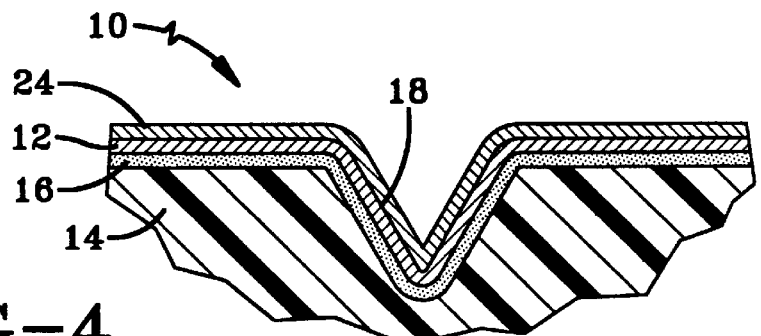
FIGS. 4–10 illustrate process steps in forming a flexible circuit according to the present invention.

The mandrel can then be used for semi-additive construction of circuitry which in one embodiment, is generally described as follows:

As shown in FIG. 4, the mandrel and its depression or depressions (dimples) 18 is then coated with a copper coating 24, typically referred to as flash plated, which covers the entire surface of the mandrel, including the surface of the depressions. The flash plated copper is applied by electroplating or other known techniques and provides a thin conductive coating that prevents the adhesive (that will be used to laminate the circuit substrate) from adhering to the mandrel surface. Flash plating is a conventional electrolytic plating formed in a very short or momentary operation so that only a very thin plating coat is provided. The flash plated coat is very thin compared to the thickness of the electrical circuit traces that are made. For example, for a circuit trace of 1 ½ mil thickness, a flash plating of copper on the mandrel will have a thickness of 0.01 to 0.2 mils. The thin flash plating is employed because it can be relatively easily released from the stainless steel mandrel, and, in addition, may be readily removed from the lamination after separation from the mandrel by a flash etching, which is a very short time or momentary etching process. Obviously, other methods for coating the mandrel with a very thin coat of conductive material that is readily separable from the mandrel and which can be readily removed from the completed circuit traces may be employed in the place of the electrolytic flash plating. Such methods may include sputtering, vapor deposition and electroless plating. If deemed necessary or desirable, the mandrel may be made of a non-electrically conductive material because the thin electrically conductive coating itself enables the additive electroplating of the circuit traces and raised features. The coating, for a dielectric mandrel, can be applied by electroless plating, sputtering, or additional conductive particles in solution. No pattern of non-conductive material, such as Teflon, needs to be permanently affixed to the mandrel. Instead, the flash plated copper is coated with a photoresist 26, which is then optically exposed through a mask defining a pattern of the desired circuit and developed. The photoresist that has not been polymerized is then removed to leave the partially completed assembly in the configuration illustrated in FIG. 5. As shown, the flash plated copper coating 24 now bears a pattern 26 of photoresist that is a negative pattern of the circuit trace pattern to be fabricated with this mandrel.

Figure 5:
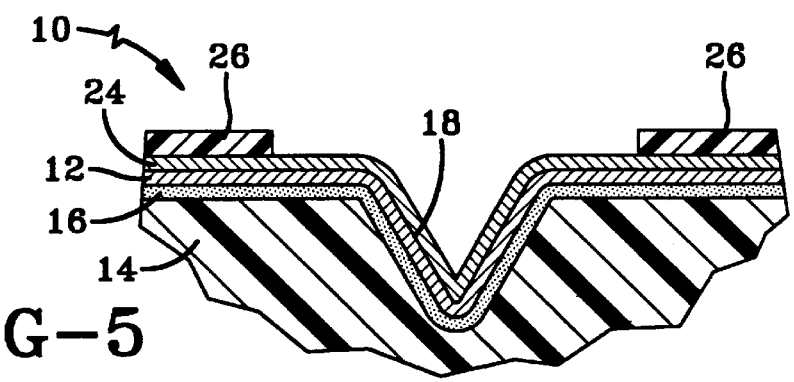
Figure 6:
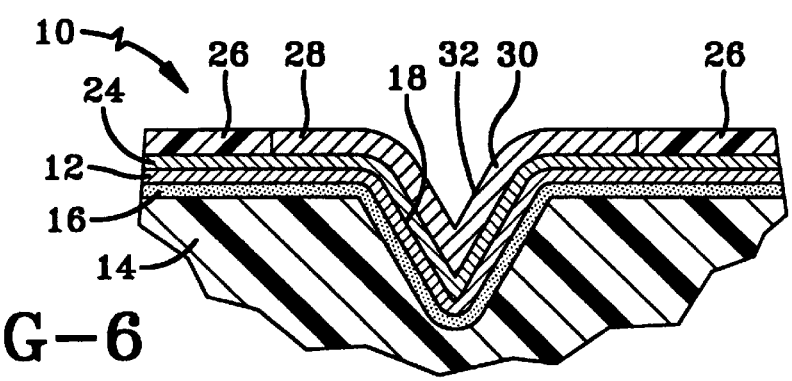

The mandrel assembly of FIG. 5 is then subjected to a suitable additive electroforming process, such as, for example, electroplating, to plate up copper traces 28, including a raised feature 30 in the depression or dimple 18, as shown in FIG. 6. The copper traces 28 are plated directly onto those portions of the flash plated copper coating 24 that are not covered by the negative pattern of developed photoresist 26. Thus the plating process simultaneously forms both the circuit traces and the raised features. The raised features 30 are partly hollow, having a depression 32 (FIG. 6). If deemed necessary or desirable, the depression 32 formed in the electroplated raised feature 30 may be filled with a solid material 34 (FIG. 7) by placing a dollop of epoxy in the depression and then allowing the epoxy to cure.

Figure 7:
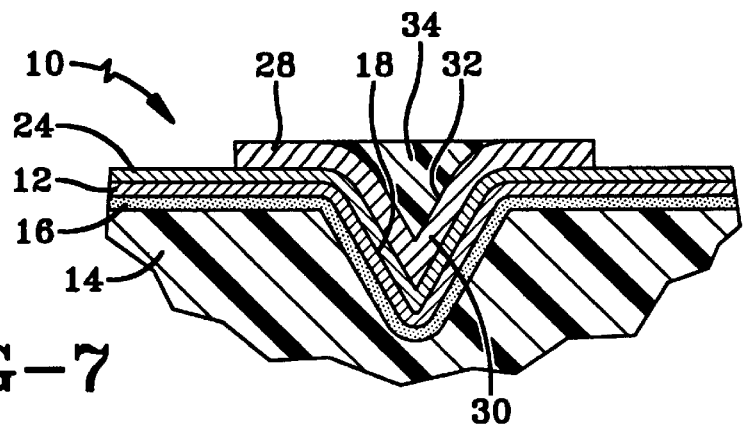

The photoresist 26 is then stripped to leave the circuit traces and raised feature 30 on the flash plated copper coating 24 which is still on the mandrel, as shown in FIG. 7. Now a layer of a suitable dielectric and adhesive layer 36, such as, for example, a layer 36 of Kapton and an adhesive, are laminated to the mandrel assembly with the traces and circuit features thereon under suitable high temperatures and pressures. This causes the Kapton and adhesive to flow into the spaces between the traces and thereby contact traces and pads on three sides. Only that side of the traces and pads that is directly in contact with the flash plated copper on the mandrel is not contacted by the adhesive/Kapton substrate 36.

Figure 8:
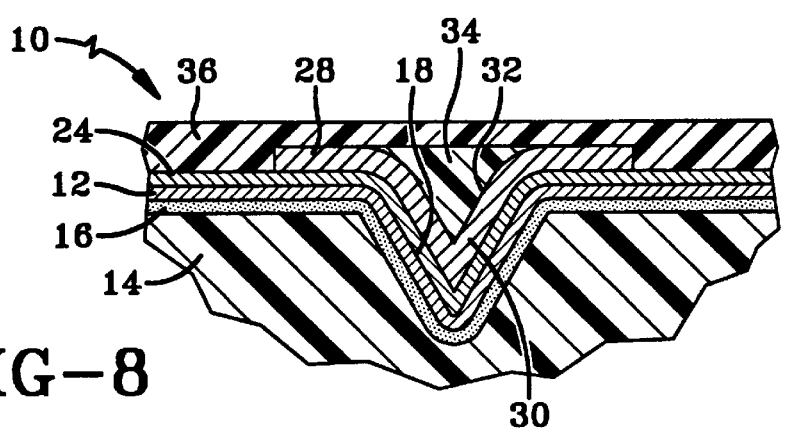

The assembly now appears as in FIG. 8, including the mandrel 10, the flash plated copper 24, traces, pads and features 30, and the Kapton/adhesive substrate 36.

Figure 9:
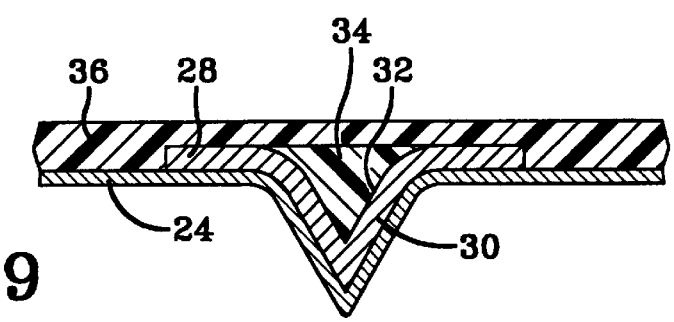

The circuit assembly of FIG. 8 is then removed from the mandrel (FIG. 9). Because only the flash plated copper contacts the mandrel, this may be readily separated, and no adhesive of the substrate 14 is in contact with the mandrel. Thus it will be seen that because the mandrel has been initially coated with the protective layer of the flash plated copper 24, the assembly of dielectric/adhesive substrate and circuit traces and raised features can be readily separated from the mandrel, together with the flash plated copper coating. This separated sub-assembly is shown removed from the mandrel in FIG. 9.

Figure 10:
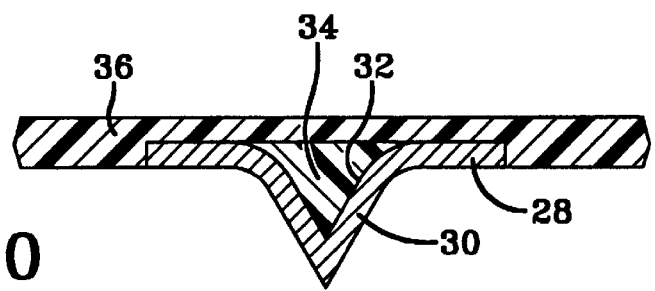

Then, as indicated in FIG. 10, the flash plated copper coating, which covers the entire lower (as viewed in FIG. 9) surface of the assembly is removed by a flash etching process to yield the finished or substantially finished sub-assembly of FIG. 10. The sub-assembly of FIG. 10 is ready for the coverlay lamination, which comprises the standard process for covering at least the side of the sub-assembly bearing the conductive traces with an insulative coverlay.

If deemed necessary or desirable, the removal of the flash plated copper coating may be controlled by a "stop" layer of gold, which will protect the thicker copper circuit during flash etch removal of the flash plated copper. To this end, the flash coated mandrel with its photolithographically defined resist pattern 26 in place, may be plated with a thin layer of gold, about 0.00006 inches thick, upon which the circuitry 28 will be plated. This patterned gold "stop" layer allows the flash plated copper to be removed by the flash etching from the dielectric, but protects the copper circuit.

We claim:

1. A method comprising:

forming a mandrel for use in semi-additive construction of circuitry by securing a stainless steel foil to a deformable substrate, thereby forming at least one dimple depression in the foil and the substrate, and using the mandrel for semi-additive construction of a circuit having a raised feature associated with the location of the dimple in the mandrel.

2. A method as set forth in claim 1 wherein said foil is less than $4/1000$ inches thick.

3. A method as set forth in claim 1 wherein the substrate comprising polyimide glass board.

4. A method as set forth in claim 1 wherein said substrate comprises flexible polyimide layer.

5. A method as set forth in claim 1 further comprising the steps of:

coating said mandrel and said dimple with an electrically conductive material such that said coating is relatively separable from said mandrel and said dimple, additively forming a pattern of circuit traces on said coating and said dimple, laminating a dielectric substrate to the traces and to the dimple, wherein the coating effectively blocks the dielectric substrate from adhering to the mandrel, removing the traces, the substrates, and the coating from the mandrel, the step of additively forming including forming a raised feature that projects from the plane of the circuit traces, and removing the coating from the traces, the raised feature and the substrate after the step of removing from the mandrel.

6. A method of making a circuit by semi-additive construction comprising:

forming a mandrel by securing a stainless steel foil to a substrate and thereafter forming at least one dimple in the foil and the substrate;

coating the mandrel and the dimple with an electrically conductive material such that the coating is relatively separable from the mandrel and the dimple;

additively forming a pattern of circuit traces on the coating and the dimple;

laminating a dielectric substrate to the traces and to the dimple, wherein the coating effectively blocks the dielectric substrate from adhering to the mandrel;

removing the traces, the substrates, and the coating from the mandrel, the step of additively forming including forming at least one raised feature associated with the location of the dimple that projects from the plane of the circuit traces; and removing the coating from the traces, the raised feature and the substrate after the step of removing from the mandrel.

* * * * *